(12) United States Patent
Xiong et al.

(10) Patent No.: US 7,445,808 B2
(45) Date of Patent: Nov. 4, 2008

(54) METHOD OF FORMING A SUPERCONDUCTING ARTICLE

(75) Inventors: Xuming Xiong, Niskayuna, NY (US); Venkat Selvamanickam, Wynantskill, NY (US); Ping Hou, Schenectady, NY (US)

(73) Assignee: Superpower, Inc., Schenectady, NY (US)

( * ) Notice: Subject to any disclaimer, the term of this patent is extended or adjusted under 35 U.S.C. 154(b) by 0 days.

(21) Appl. No.: 11/320,104

(22) Filed: Dec. 28, 2005

(65) Prior Publication Data

US 2007/0148330 A1   Jun. 28, 2007

(51) Int. Cl.
  *B05D 5/12* (2006.01)
  *B05D 3/00* (2006.01)
  *H01L 39/24* (2006.01)

(52) U.S. Cl. .......... 427/62; 427/561; 427/585; 29/599; 505/434; 505/470; 505/740; 204/192.15; 204/192.24

(58) Field of Classification Search ........... 427/62, 427/561, 585; 29/599; 505/434, 470, 740; 204/192.15, 192.24
See application file for complete search history.

(56) References Cited

U.S. PATENT DOCUMENTS

| | | | |
|---|---|---|---|
| 5,236,509 A * | 8/1993 | Sioshansi et al. ............ 118/719 |
| 5,650,378 A | 7/1997 | Iijima et al. | |
| 6,190,752 B1 | 2/2001 | Do et al. | |
| 6,214,772 B1 * | 4/2001 | Iijima et al. ................ 505/475 |
| 6,312,819 B1 * | 11/2001 | Jia et al. .................... 428/450 |
| 6,319,326 B1 * | 11/2001 | Koh et al. ................... 118/718 |
| 6,555,256 B1 * | 4/2003 | Christen et al. ............. 428/697 |
| 6,849,580 B2 * | 2/2005 | Norton et al. ............... 505/237 |
| 6,849,583 B2 | 2/2005 | Corr et al. | |
| 6,998,028 B1 | 2/2006 | Selvamanickam et al. | |
| 7,071,149 B2 * | 7/2006 | Selvamanickam ........... 505/237 |
| 2002/0144838 A1 | 10/2002 | Fritzemeier et al. | |
| 2003/0144150 A1 | 7/2003 | Arendt et al. | |
| 2004/0016401 A1 * | 1/2004 | Ignatiev et al. ............. 118/718 |
| 2004/0168636 A1 * | 9/2004 | Savvides et al. ...... 118/723 CB |
| 2004/0248743 A1 | 12/2004 | Norton et al. | |
| 2005/0139380 A1 | 6/2005 | Knoll et al. | |
| 2005/0164889 A1 | 7/2005 | Selamanickam | |
| 2005/0220986 A1 | 10/2005 | Selvamanickam et al. | |
| 2006/0116293 A1 * | 6/2006 | Norton et al. ............... 505/237 |

* cited by examiner

*Primary Examiner*—Brian K Talbot
(74) *Attorney, Agent, or Firm*—Larson Newman Abel Polansky & White, LLP

(57) ABSTRACT

A superconducting article and a method of making a superconducting article is described. The method of forming a superconducting article includes providing a substrate, forming a buffer layer to overlie the substrate, the buffer layer including a first buffer film deposited in the presence of an ion beam assist source and having a uniaxial crystal texture. The method further includes forming a superconducting layer to overlie the buffer layer.

17 Claims, 3 Drawing Sheets

METHOD OF FORMING A SUPERCONDUCTING ARTICLE

CROSS-REFERENCE TO RELATED APPLICATION(S)

BACKGROUND

1. Field of the Disclosure

The invention relates to superconductive articles and methods of making superconducting articles, more specifically to textured films formed by ion beam assisted deposition.

2. Description of the Related Art

Superconductor materials have long been known and understood by the technical community. Low-temperature (low-$T_c$) superconductors exhibiting superconductive properties at temperatures requiring use of liquid helium (4.2 K), have been known since about 1911. However, it was not until somewhat recently that oxide-based high-temperature (high-$T_c$) superconductors have been discovered. Around 1986, a first high-temperature superconductor (HTS), having superconductive properties at a temperature above that of liquid nitrogen (77 K) was discovered, namely $YBa_2Cu_3O_{7-x}$ (YBCO), followed by development of additional materials over the past 15 years including $Bi_2Sr_2Ca_2Cu_3O_{10+y}$ (BSCCO), and others. The development of high-$T_c$ superconductors has created the potential of economically feasible development of superconductor components incorporating such materials, due partly to the cost of operating such superconductors with liquid nitrogen rather than the comparatively more expensive cryogenic infrastructure based on liquid helium.

Of the myriad of potential applications, the industry has sought to develop use of such materials in the power industry, including applications for power generation, transmission, distribution, and storage. In this regard, it is estimated that the native resistance of copper-based commercial power components is responsible for billions of dollars per year in losses of electricity, and accordingly, the power industry stands to gain based upon utilization of high-temperature superconductors in power components such as transmission and distribution power cables, generators, transformers, and fault current interrupters. In addition, other benefits of high-temperature superconductors in the power industry include a factor of 3-10 increase of power-handling capacity, significant reduction in the size (i.e., footprint) of electric power equipment, reduced environmental impact, greater safety, and increased capacity over conventional technology. While such potential benefits of high-temperature superconductors remain quite compelling, numerous technical challenges continue to exist in the production and commercialization of high-temperature superconductors on a large scale.

Among the challenges associated with the commercialization of high-temperature superconductors, many exist around the fabrication of a superconducting tape that can be utilized for formation of various power components. A first generation of superconducting tape includes use of the above-mentioned BSCCO high-temperature superconductor. This material is generally provided in the form of discrete filaments, which are embedded in a matrix of noble metal, typically silver. Although such conductors may be made in extended lengths needed for implementation into the power industry (such as on the order of kilometers), due to materials and manufacturing costs, such tapes do not represent a commercially feasible product.

Accordingly, a great deal of interest has been generated in the so-called second-generation HTS tapes that have superior commercial viability. These tapes typically rely on a layered structure, generally including a flexible substrate that provides mechanical support, at least one buffer layer overlying the substrate, the buffer layer optionally containing multiple films, an HTS layer overlying the buffer film, and an electrical stabilizer layer overlying the superconductor layer, typically formed of at least a noble metal. However, to date, numerous engineering and manufacturing challenges remain prior to full commercialization of such second generation-tapes.

One of the more difficult challenges in creating commercially viable second generation-tapes has been the formation of a biaxially textured HTS layer. In the past, a biaxially textured HTS layer has been achieved by epitaxially growing the HTS layer on top of at least one biaxially textured buffer film. Typically, the biaxially textured buffer films have been formed using a process known as ion beam assisted deposition, or IBAD in order to create the proper crystalline template for epitaxial growth of a suitable biaxially textured HTS layer. The initial films in the buffer layer initialize the templating effect towards forming a suitable biaxially textured buffer film and HTS layer. However, such methods have proven particularly demanding because they require deposition of layers having a precise crystal structure and texture to ensure the proper epitaxial growth of a suitable HTS layer.

While the formation of an effective biaxially textured buffer film has improved with the advent of the IBAD process, given the rigorous requirements in growing a particular crystal structure with particular texture, the formation of the buffer stack is still a relatively slow and expensive process. Such requirements, while important, impose a significant impediment to the large-scale production of superconducting tapes, since it would affect the ability to produce a low-cost HTS tape.

Accordingly, there is a need in the art for improved methods of forming superconducting components. In particular, there is a need in the art for improved processing techniques for creating constituent layers of a superconducting article having precise crystal structure and texturing, and for producing commercially viable HTS articles and devices.

SUMMARY

According to one aspect, a method of forming a superconducting article is provided. The method includes providing a substrate, forming a buffer layer to overlie the substrate, the buffer layer including a first buffer film deposited in the presence of an ion beam assist source and having a uniaxial crystal texture. The method further includes forming a superconducting layer to overlie the buffer layer.

BRIEF DESCRIPTION OF THE DRAWINGS

The present disclosure may be better understood, and its numerous features and advantages made apparent to those skilled in the art by referencing the accompanying drawings.

DESCRIPTION OF THE PREFERRED EMBODIMENT(S)

Figure 1:
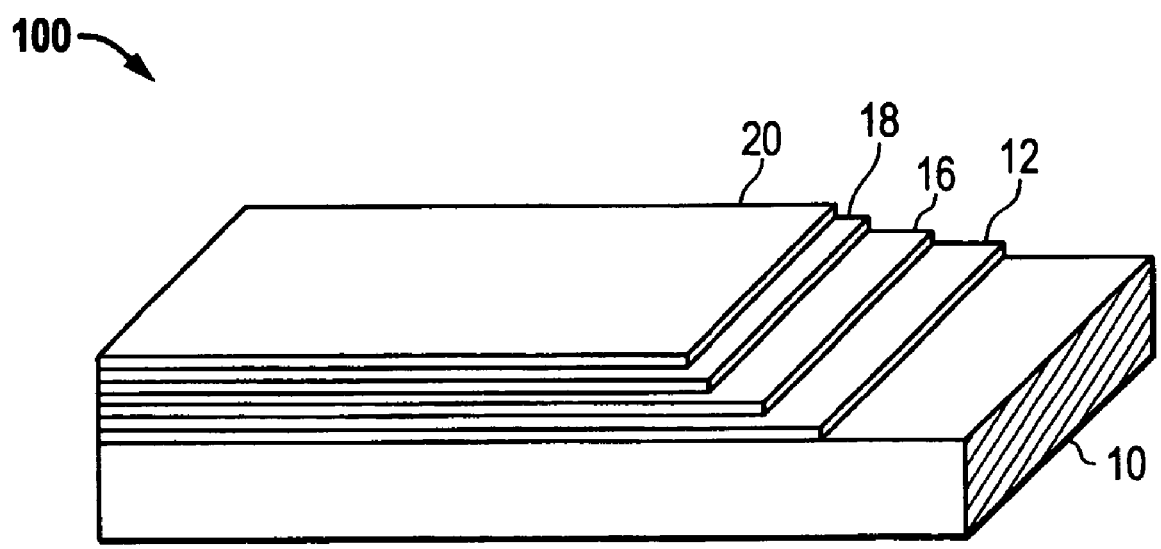
FIG. 1 illustrates a perspective view showing the generalized structure of a superconducting article according to an embodiment of the present invention.

Turning to FIG. 1, a general layered structure of a superconducting article is depicted for illustrative purposes. The superconducting article includes a substrate 10, a buffer layer 12 overlying the substrate 10, and a superconducting layer 16. Optionally, the superconducting article can also include a capping layer 18 over the superconducting layer, which typically includes a noble metal layer. The superconducting article can optionally include a stabilizer layer 20, which typically includes a non-noble metal.

According to one embodiment, the formation of a superconducting article includes providing a substrate 10. The substrate 10 is generally metal-based, and typically, an alloy of at least two metallic elements. Particularly suitable substrate materials include nickel-based metal alloys such as the known Inconel® group of alloys. The Inconel® alloys tend to have desirable creep, chemical and mechanical properties, including coefficient of expansion, tensile strength, yield strength, and elongation. These metals are generally commercially available in the form of spooled tapes, particularly suitable for superconductor tape fabrication, which typically will utilize reel-to-reel tape handling.

According to one embodiment, the substrate 10 is in a tape-like configuration, having a high dimension ratio. For example, the width of the tape is generally on the order of about 0.4-10 cm, and the length of the tape is typically at least about 100 m, most typically greater than about 500 m. Embodiments provide for superconducting tapes that include a substrate 10 having a length on the order of 1 km or above. Accordingly, the substrate can have a dimension ratio which is fairly high, on the order of not less than 10, not less than about $10^2$, or even not less than about $10^3$. Certain embodiments are longer, having a dimension ratio of $10^4$ and higher. As used herein, the term 'dimension ratio' is used to denote the ratio of the length of the substrate or tape to the next longest dimension, the width of the substrate or tape.

Furthermore, the substrate can be treated so as to have desirable surface properties for subsequent deposition of the constituent layers of the superconductor tape. For example, the surface may be lightly polished to a desired flatness and surface roughness, after which the surface is also typically cleaned followed by annealing and ion-treatment. Such techniques are described more fully in U.S. Ser No. 10/816,045, filed Apr. 1, 2004 incorporated herein by reference and commonly assigned.

Additionally, the substrate may be biaxially textured as is understood in the art, such as by the known RABiTS (roll assisted biaxially textured substrate) technique. Furthermore, an optional protective layer (not illustrated) can be formed over the substrate, typically comprising an oxide material for ease of deposition of a buffer layer 12.

Turning to the buffer layer 12, the buffer layer may be a single layer, or more commonly, be made up of several films. Most typically, the buffer layer includes at least one biaxially textured film, having a crystalline texture that is generally aligned along crystal axes both in-plane and out-of-plane of the film. As is understood in the art, biaxial texturing may be accomplished by IBAD. IBAD is an acronym that stands for ion beam assisted deposition, a technique that may be advantageously utilized to form a suitably textured buffer film for subsequent formation of a superconductor layer having desirable crystallographic orientation for superior superconducting properties. Generally, the biaxially textured IBAD film has a rock-salt like crystal structure, as defined and described in U.S. Pat. No. 6,190,752, incorporated herein by reference, and further described below in accordance with the embodiments.

The superconducting layer 16 is generally in the form of a high-temperature superconducting (HTS) layer. HTS materials are typically chosen from any of the high-temperature superconducting materials that exhibit superconducting properties above the temperature of liquid nitrogen, 77K. Such materials may include, for example, $YBa_2Cu_3O_{7-x}$, $Bi_2Sr_2Ca_2Cu_3O_{10+y}$, $Tl_2Ba_2Ca_2Cu_3O_{10+y}$, and $HgBa_2Ca_2Cu_3O_{8+y}$. One class of materials includes $REBa_2Cu_3O_{7-x}$, wherein RE is a rare earth element. Of the foregoing, $YBa_2Cu_3O_{7-x}$, also generally referred to as YBCO, may be advantageously utilized. The superconducting layer 16 may be formed by any one of various techniques, including thick and thin film forming techniques. Preferably, a thin film physical vapor deposition technique such as pulsed laser deposition (PLD) can be used for a high deposition rates, or a chemical vapor deposition technique can be used for lower cost and larger deposition zone. Typically, the superconducting layer 16 has a thickness on the order of about 1 to about 30 microns, most typically about 2 to about 20 microns, such as about 2 to about 10 microns, in order to get desirable amperage ratings associated with the superconductor layer 14.

The capping layer 18 and the stabilizer layer 20 are generally implemented to provide a low resistance interface and for electrical stabilization to aid in prevention of superconductor burnout in practical use. More particularly, layers 18 and 20 aid in continued flow of electrical charges along the superconductor in cases where cooling fails or the critical current density is exceeded, and the superconductor layer moves from the superconducting state and becomes resistive. Typically, a noble metal is utilized for capping layer 18 to prevent unwanted interaction between the stabilizer layer(s) and the superconductor layer 16. Typical noble metals include gold, silver, platinum, and palladium. Silver is typically used due to its cost and general accessibility. The capping layer 18 is typically made to be thick enough to prevent unwanted diffusion of the components from the stabilizer layer 20 into the superconductor layer 16, but is made to be generally thin for cost reasons (raw material and processing costs). Typical thicknesses of the capping layer 18 range within about 0.1 to about 10.0 microns, such as 0.5 to about 5.0 microns. Various techniques may be used for deposition of the capping layer 18, including physical vapor deposition, such as DC magnetron sputtering.

Figure 2:
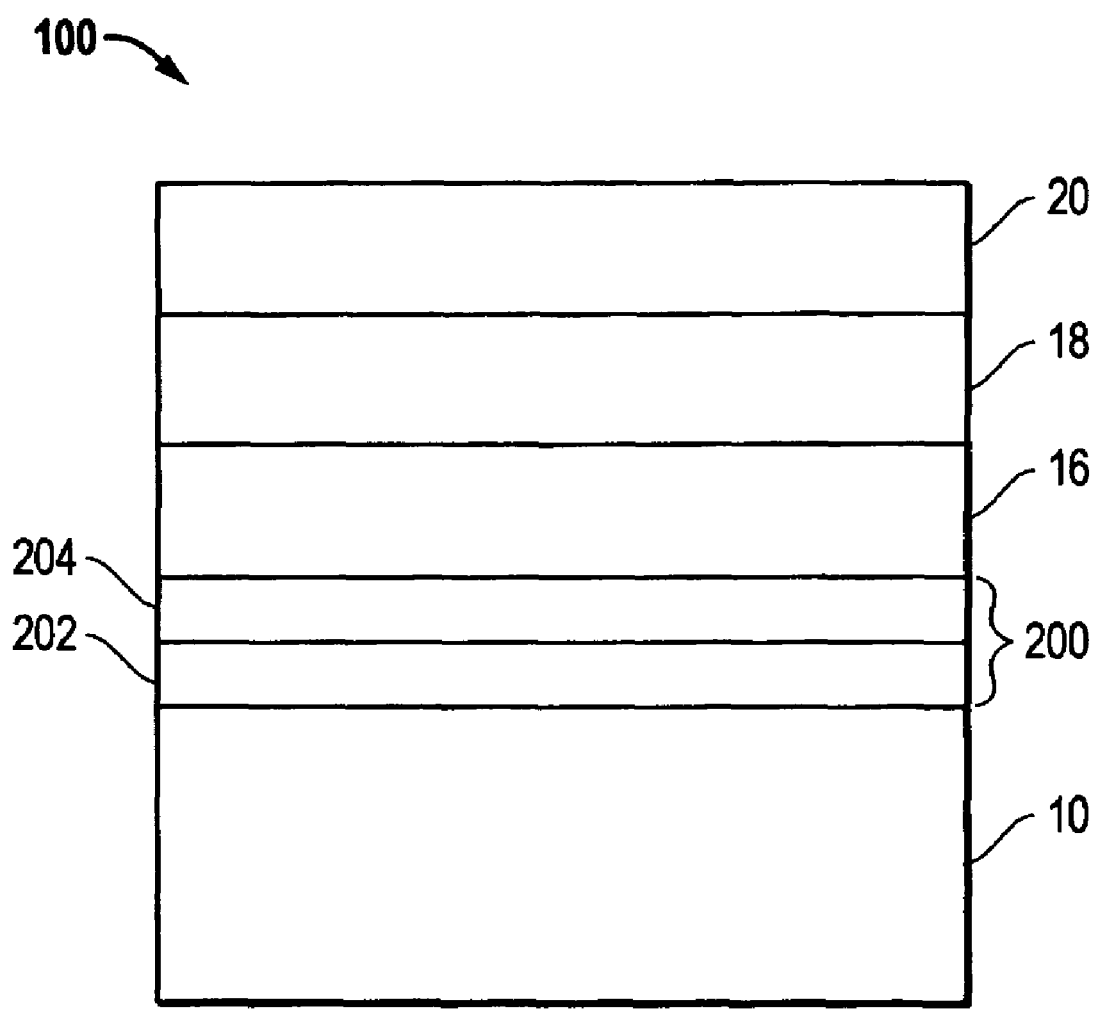
FIG. 2 illustrates a cross sectional view showing the generalized structure of a superconducting article according to an embodiment of the present invention.

The stabilizer layer 20 is generally incorporated to overlie the superconducting layer 16, and in particular, overlie and directly contact the capping layer 18 in the particular embodiment shown in FIG. 1. The stabilizer layer 20 functions as a protection/shunt layer to enhance stability against harsh environmental conditions and superconductivity quench. The layer is generally dense and thermally and electrically conductive, and functions to bypass electrical current in case of failure of the superconducting layer. It may be formed by any one of various thick and thin film forming techniques, such as by laminating a pre-formed copper strip onto the superconducting tape, by using an intermediary bonding material such as a solder or flux. Other techniques have focused on physical vapor deposition, typically evaporation or sputtering, as well as wet chemical processing such as electroless plating, and electroplating. In this regard, the capping layer 16 may function as a seed layer for deposition of copper thereon Turning to FIG. 2, a cross section of the layers of a superconducting article is provided, in particular, two films of buffer layer 200 are illustrated. According to the illustrated embodiment, the buffer layer 200 of the superconducting article 100 includes a uniaxially textured buffer film 202 and a biaxially textured film 204. According to a particular development, the uniaxially textured buffer film is formed by an ion beam assisted deposition (IBAD) process over the substrate. Similarly, the biaxially textured buffer film 204 may be deposited by ion beam assisted deposition (IBAD) over the uniaxially textured buffer film 202. The uniaxially textured IBAD buffer film 202 generally has a thickness within a range of about 50 to about 500 Angstroms and the biaxially textured buffer film 204 generally has a thickness within a range of 100 to 5000 Angstroms.

The IBAD process is typically a physical vapor deposition process (PVD) in which the species to be deposited are liberated by physical removal from a target, such as by sputtering, pulsed laser deposition, or evaporation. Of the foregoing, reactive sputtering may be used, such as detailed in U.S. Pat. No. 6,998,028, filed Sep. 24, 2004, incorporated herein by reference and commonly assigned.

Generally, the uniaxially textured IBAD buffer film 202 has uni-texture along an out-of-plane direction, which extends normal to the plane of the substrate.

As used herein, the term "texture" refers to a grain-to-grain crystallographic misorientation of the respective film known and quantified as "mosaic spread". Typically, the mosaic spread for a textured layer is less than about 30 degrees, such as less than about 20 degrees, 15 degrees, 10 degrees, or 5 degrees, but is generally finite typically being greater than about 1°. Regarding the out-of-plane crystallographic texture, the mosaic spread is generally represented by a full-width-at-half-maximum value of an x-ray diffraction peak, such as obtained by a <001> rocking curve measurement. In this case, the <001> crystallographic direction of the grains are aligned and thus textured in a direction along the film normal within an angular spread of less than about 30 degrees. According to the embodiments discussed above, the term "no significant texture," generally refers to a grain-to-grain misorientation "mosaic spread" of the respective layer being greater than about 30 degrees and including generally random polycrystalline arrangements.

According to a particular feature of an embodiment, the texture of the uniaxially textured buffer film 202 can provide two alternatives. The first alternative feature is a templating effect for epitaxial growth. In one embodiment, the material of the uniaxially textured buffer film 202 is formed with sufficient quality and orientation to have a desired templating effect for the formation of the overlying film (typically the biaxially textured buffer film 204). More specifically, the crystallographic orientation of the uniaxially textured buffer film 202 (e.g., the out-of-plane orientation) is repeated in the biaxially textured buffer film 204. Additional details are provided in U.S. Pat. No. 6,849,583 filed, Jun. 9, 2003 and incorporated herein by reference and commonly assigned. In more detail, the uniaxial texture forms a desired charge balance plane to match with the charge balance plane of the overlying biaxially textured buffer film, so the desired out-of-plane orientation of the biaxially-textured buffer can be fortified. For IBAD MgO, the desired (001) out-of-plane orientation of MgO is a charge balanced plane, so the surface plane of underlying film is generally charge balanced. Accordingly, as a uniaxially textured buffer layer having a charge balanced out-of-plane unitexture is formed, the uniaxial texture will outperform conventional polycrystalline films.

According to an alternative feature of the embodiment described above, the uniaxially textured buffer film is an anti-epitaxial film. According to one embodiment, the material forming the anti-epitaxial film is of a sufficient quality (low mosaic spread) and orientation to ensure that the final surface presented for growth of the next overlying layer (typically the biaxially textured film 204) has a non-templating effect. In such an embodiment, the high degree of uniaxial texture provided by the IBAD process can help assure that a random crystal grain does not take on an orientation that results in local templating of the next layer, which may negatively impact the desired biaxial texture of the overlying layer.

As used herein, the term "anti-epitaxial" is used to define a selected crystalline material, which has certain characteristics that prevent or inhibit preferential reproduction of the crystal structure in a subsequent overlying film, such as an anti-templating film. The uniaxially textured IBAD buffer film 202 may function as an "anti-templating" film for the biaxially-textured IBAD buffer film 204 by various means, which generally includes selection of materials with crystal structures and/or characteristics that inhibit templating effects with a particular overlying buffer film. Additional details are provided in U.S. patent application Ser. No. 11/319,971 filed contemporaneously with the present application, incorporated herein by reference and commonly assigned. In more detail, the uniaxial texture may be used to realize different surface lattice symmetry between the overlying biaxially-textured layer and the anti-epitaxy film. For example, MgO tends to have (001) out of plane orientation when film is very thin due to a charge balance effect. Accordingly, the surface lattice symmetry is a 4-fold square structure. If the anti-epitaxy layer forms (111) out-of-plane orientation, the surface lattice symmetry of anti-epitaxy layer is 3 or 6 fold symmetry, different from the biaxially-textured layer thereby preventing epitaxial growth.

The high degree of texture and orientation achieved by forming the uniaxially textured buffer film 202 by IBAD, whether epitaxial or anti-epitaxial, may serve to improve the quality, ease and reproducibility of the formation of the biaxially textured IBAD buffer film 204. For example, the formation of a uniaxially textured buffer film 202 having a high degree of texture and orientation can reduce the time necessary to form a suitable biaxially textured IBAD buffer film 204, thus improving the commercial viability of producing a HTS article and related devices. Suitable materials for the uniaxially textured buffer film 202 depend in part upon the desired feature of the layer. Typical suitable materials may include MgO, NiO, YSZ, $CeO_2$, $Y_2O_3$, $TiO_2$, $SnO_2$, $Mn_3O_4$, $Fe_3O_4$, $Cu_2O$, and $RE_2O_3$, wherein RE is a rare earth element.

Turning to the formation of the biaxially textured IBAD buffer film 204, the film has a crystalline texture that is generally aligned both in-plane and out-of-plane. As defined herein, a "biaxially textured film" is a polycrystalline material in which both the crystallographic in-plane and out-of-plane grain-to-grain misorientation "mosaic spread" is less than about 30 degrees, such as less than about 20 degrees, 15 degrees, 10 degrees, or 5 degrees.

The biaxially textured IBAD buffer film 204 is preferably has an (001) out-of-plane orientation. The IBAD buffer film 204 may be aligned along a first axis of the [001] crystal direction, and along a second axis having a crystal direction selected from the group consisting of [111], [101], [113], [100], and [010]. The biaxially textured IBAD buffer film 204 can have a rock-salt-like crystal structure and comprise MgO, NiO or can include other materials such as YSZ, $CeO_2$, $Y_2O_3$, $TiO_2$, $SnO_2$, $Mn_3O_4$, $Fe_3O_4$, $Cu_2O$, or $RE_2O_3$, wherein RE is a rare earth element.

Figure 3:
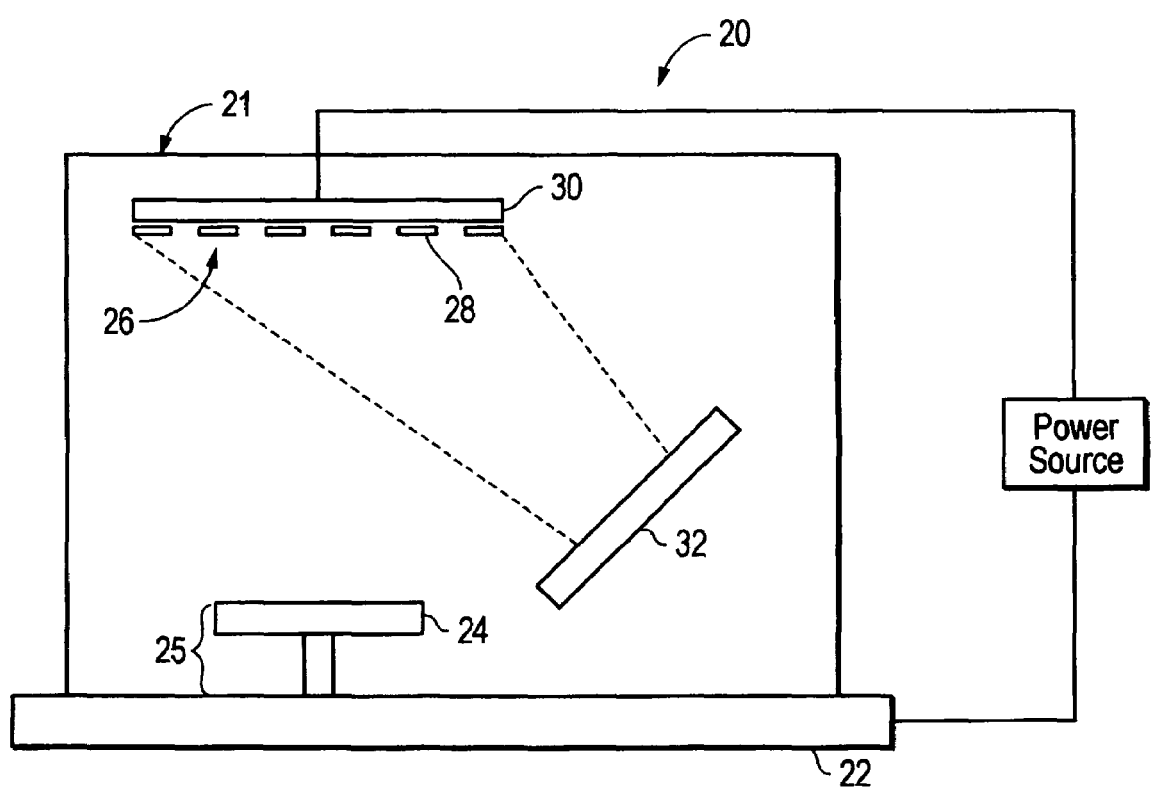
FIG. 3 illustrates the basic structure of an IBAD apparatus.

Turning to additional details relating to forming buffer films of a superconducting article, attention is drawn to FIG. 3. FIG. 3 is a schematic of an IBAD processing apparatus 20, which includes a vacuum chamber 21 joined to a base 22. The apparatus includes a target 24, and in the context of a reactive sputtering process, is generally formed of a metallic element or elements making up the ceramic composition that forms the textured buffer films, such as Y and Zr in the case of YSZ buffer films. However, other metallic elements may be used, generally one of, or optionally a combination of Mg, Ni, Ce, Y, Ti, Sn, Mn, Fe, Cu, and RE (rare earth elements), depending on the intended composition of the buffer films. The target 24 is mounted to a pedestal, and is the source for the raw material forming the material plume throughout the deposition zone of the vacuum chamber 21, particularly between the target 24 and the substrate. Here, the substrate is in the form of a substrate tape 26, which is helically wound so as to make multiple passes in the form of segments 28. In the embodiment shown, the substrate tape 26 forms a helix having six segments, routed so as to pass over substrate block 30. Although not shown, the helix of tape segments 28 is routed into or through the vacuum chamber 21 via a reel-to-reel mechanism. A power source is connected as shown to generate the material plume causing reaction, typically oxidation, of the sputtered material and subsequent deposition of the reacted target material along the segments 28. The power source may be a pulsed DC source to aid in processing (e.g., reduce/eliminate arcing related to the oxidation area on the target). In such a case, the power may be pulsed at a rate of 1 to 10 kHz.

The substrate block 30 may be in the form of a long metal block having an internal coolant passageway to increase the heat capacity for heat dissipation. The length of the substrate block extends along at least the length of the deposition zone, generally on the order of 0.5 meter to 10 meters or greater, depending upon the size of the IBAD apparatus.

To enable the formation of a well textured film, particularly a film that has uniaxial texturing or biaxial texturing as described in detail above, an ion assist source 32 is provided to generate assist ions that travel through and impact the material plume enabling alignment of the depositing species, with desirable low mosaic spread values.

EXAMPLES

It should be understood that the examples and embodiments described herein are for illustrative purposes only and that various modifications or changes in light thereof will be suggested to persons skilled in the art and are to be included within the scope of this application.

Example 1

A Ni-based alloy substrate is provided for film growth. The substrate is cleaned with solvents, such as acetone, methanol, and trichloroethylene. The substrate is mounted in a e-beam evaporation chamber for thin film deposition. A MgO protective layer is deposited on the substrate using e-beam evaporation deposition at about 25° C. under vacuum. This protective layer attenuates chemical reactions between the buffer layer and the substrate.

Then, an uniaxially textured buffer film is formed, comprising $Y_2O_3$, by magnetron sputtering on the MgO coated substrate, The $Y_2O_3$ film is about 7 nm thick and is deposited at about 700° C. The $Y_2O_3$ film is unitextured, has (111) out-of-plane orientation. The in-plane crystallographic orientation of film is random. This (111) uni-textured $Y_2O_3$ can also be obtained by depositing $Y_2O_3$ at room temperature, while at same time bombarding the growing film with an ion beam.

Then, the $Y_2O_3$ coated substrate is heated to a temperature suitable for the growth of the biaxially textured IBAD buffer film on the uniaxially textured $Y_2O_3$ buffer film. Ion beam assisted deposition is employed to deposit an epitaxial MgO. The MgO layer favors the [001] out-of-plane direction. The MgO is also biaxially textured, due to the presence of the Ar ion beam.

According to embodiments herein, commercially reproducible superconducting articles have been provided having exemplary texture in the characteristic buffer layer enabling exemplary texture in the superconducting layer. Embodiments obviate the need to rely on amorphous surfaces on which biaxially textured buffer films are grown, which surfaces may be difficult to reproducibly achieve in practice. Further, embodiments herein represent a shift from prior work disclosed in U.S. Pat. No. 6,849,580, which utilizes a non-IBAD process of uniaxially texturing a film on which a biaxial film is epitaxially grown.

While particular aspects of the present invention have been described herein with particularity it is well understood that those of ordinary skill in the art may make modifications hereto yet still be within the scope of the present claims. The previously mentioned embodiments and examples, in no way limit the scope of the following claims.

What is claimed is:

1. A method of forming a superconducting article comprising:
   providing a substrate;
   forming a buffer layer to overlie the substrate, the buffer layer including a first buffer film and a second buffer film, said first buffer film deposited in the presence of an ion beam assist source, being an anti-epitaxial film, and having a uniaxial crystal texture characterized by (i) texture in a first crystallographic direction that extends out-of-plane of the first buffer film with no significant texture in a second direction that extends in-plane of the first buffer film, or (ii) texture in a first crystallographic direction that extends in-plane of the first buffer film with no significant texture in a second direction that extends out-of-plane of the first buffer film, said second buffer film deposited in the presence of an ion assist source and having a biaxial crystal texture, and wherein the anti-epitaxial film has a crystal structure to inhibit crystallographic templating of the second buffer film; and
   forming a superconducting layer to overlie the buffer layer.

2. The method of claim 1, wherein the first buffer film comprises a material selected from the group consisting of MgO, NiO, YSZ, $CeO_2$, $Y_2O_3$, $TiO_2$, $SnO_2$, $Mn3O4$, $Fe_3O_4$, $Cu_2O$, and $RE_2O_3$, wherein RE is a rare earth element.

3. The method of claim 2, wherein the first buffer film is selected from the group consisting of YSZ, $CeO_2$, and $Y_2O_3$.

4. The method of claim 1, wherein the first buffer film has a uniaxial, in-plane crystal texture.

5. The method of claim 1, wherein the first buffer film has a uniaxial out-of-plane crystal texture.

6. The method of claim 5, wherein the out-of-plane crystallographic texture is generally aligned along the [001] or [111] crystal direction.

7. The method of claim 6, wherein the out-of-plane texture has a mosaic spread no greater than about 30 degrees.

8. The method of claim 7, wherein said out-of-plane texture has a mosaic spread no greater than about 20 degrees.

9. The method of claim 8, wherein said out-of-plane texture has a mosaic spread no greater than about 10 degrees.

10. The method of claim 1, wherein the second buffer has an (001) out-of-plane orientation.

11. The method of claim 1, wherein forming the second buffer film comprises selecting a material from the group consisting of MgO, NiO, YSZ, $CeO_2$, $Y_2O_3$, $TiO_2$, $SnO_2$, $Mn_3O_4$, $Fe_3O_4$, $Cu_2O$, and $RE_2O_3$, wherein RE is a rare earth element.

12. The method of claim 11, wherein the second buffer film comprises a material selected from the group consisting of MgO, NiO, YSZ, $CeO_2$, and $Y_2O_3$.

13. The method of claim 1, wherein said superconducting layer comprises $REBa_2Cu_3O_7$, wherein RE is a rare earth element.

14. The method of claim 1, wherein said superconducting article provides a Jc of at least 0.5 $MA/cm^2$ at 77 K and self-field.

15. The method of claim 1, wherein said substrate has a dimension ratio of not less than about 10.

16. The method of claim 15, wherein the dimension ratio is not less than about 100.

17. The method of claim 1, wherein the article is formed using a reel-to-reel process.

\* \* \* \* \*